(12) United States Patent
Nakamura et al.

(10) Patent No.: US 8,742,317 B2
(45) Date of Patent: Jun. 3, 2014

(54) VISIBLE LIGHT RECEIVER CIRCUIT

(75) Inventors: Kousuke Nakamura, Gunma (JP); Masashi Yamada, Gunma (JP)

(73) Assignee: Taiyo Yuden Co., Ltd., Tokyo (JP)

(*) Notice: Subject to any disclaimer, the term of this patent is extended or adjusted under 35 U.S.C. 154(b) by 141 days.

(21) Appl. No.: 13/351,478

(22) Filed: Jan. 17, 2012

(65) Prior Publication Data

US 2012/0112046 A1   May 10, 2012

Related U.S. Application Data

(63) Continuation of application No. PCT/JP2010/062144, filed on Jul. 20, 2010.

(30) Foreign Application Priority Data

Nov. 18, 2009  (JP) .................................. 2009-263291

(51) Int. Cl.
    *H01L 31/00* (2006.01)
(52) U.S. Cl.
    USPC .................................................... 250/214.1
(58) Field of Classification Search
    USPC ........................................ 250/214.1; 257/200
    See application file for complete search history.

(56) References Cited

U.S. PATENT DOCUMENTS

2003/0189220 A1* 10/2003 Hamerski ..................... 257/200

FOREIGN PATENT DOCUMENTS

| JP | 56071643 | 6/1981 |
| JP | 58-214821 | 12/1983 |
| JP | 58214821 | 12/1983 |
| JP | 64-041531 | 2/1989 |
| JP | 1041531 | 2/1989 |
| JP | 03-113924 | 5/1991 |
| JP | 3113924 | 5/1991 |
| JP | H6276157 A | 9/1994 |
| JP | 2006005599 | 1/2006 |

OTHER PUBLICATIONS

Office Action in corresponding Japanese Application No. 2011-541831, dated Feb. 15, 2013, along with an English translation.
Office Action in corresponding Korean Application No. 10-2012-7001138, dated May 20, 2013, along with an English translation.
International Search Report in counterpart International Application No. PCT/JP2010/062144, mailed Sep. 21, 2010.
International Preliminary Report on Patentability in counterpart PCT Application No. PCT/JP2010/062144, mailed Jun. 21, 2012.
Office Action in corresponding Japanese Application No. 2011-541831, dated Nov. 18, 2013, along with an English translation.

* cited by examiner

*Primary Examiner* — Thanh Luu
*Assistant Examiner* — Renee Naphas
(74) *Attorney, Agent, or Firm* — Edell, Shapiro & Finnan, LLC

(57) ABSTRACT

A visible light receiver circuit, which reduces the influence of ambient light, has a simple configuration, and generates low noise, is provided. The visible light receiver circuit includes a photoelectric conversion unit. The photoelectric conversion unit includes a photodiode having a cathode connected to a power source, a resistor connected in series to an anode of the photodiode, and a nonlinear resistive circuit connected in parallel to the resistor. The nonlinear resistive circuit includes, for example, a series circuit including a Zener diode and a resistor.

4 Claims, 10 Drawing Sheets

<PRIOR ART>

<PRIOR ART>

VISIBLE LIGHT RECEIVER CIRCUIT

CROSS REFERENCE TO RELATED APPLICATIONS

This application is a continuation of International Application No. PCT/JP2010/062144, filed on Jul. 20, 2010, entitled "Visible Light Receiver Circuit," which claims priority under 35 U.S.C. §119 to Application No. JP 2009-263291 filed on Nov. 18, 2009, entitled "Visible Light Receiver Circuit," the entire contents of which are hereby incorporated by reference.

FIELD OF THE INVENTION

The present invention relates to a receiver circuit of a visible light communication system configured to perform communication using visible light, and more particularly, to a technique for reducing an influence of ambient light noise.

BACKGROUND

In recent years, in addition to wireless communications using electric waves or infrared (IR) rays, a communication using visible light such as indoor lighting devices, outdoor billboard illuminations, traffic lights, and car headlamps is at the center of attention. In particular, white light emitting diodes (LEDs) have been assiduously developed lately and applied to various fields such as illuminations, automotive lamps and backlight units (BLUs) of liquid-crystal displays. A white LED has a much higher on/off switching response speed than other light sources such as a fluorescent lamp. Thus, a visible light communication system utilizing a white light of a white LED as a data transmission medium which thereby provides a data transmission function to the white LED has been proposed.

FIG. 8 illustrates a typical configuration of a visible light receiving apparatus 100 of a conventional visible light communication system. As shown in FIG. 8, the visible light receiving apparatus 100 includes a photoelectric conversion unit 110 configured to convert a signal light transmitted by a transmitter into an analog signal, an amplifier 120 configured to amplify the analog signal to a certain signal level that may be recognized by a quantizer 130 of a subsequent stage, and the quantizer 130 configured to convert the analog signal amplified by the amplifier 120 into a digital signal that may be recognized by a digital circuit 140 of a subsequent stage. The digital circuit 140 may be, for example, a communication control circuit.

FIG. 9 illustrates a typical configuration of a photoelectric conversion unit 110 of a conventional visible light communication system. As shown in FIG. 9, the photoelectric conversion unit 110 includes a photodiode 111 serving as a light receiving unit and a resistor 112 connected to an anode of the photodiode 111 in series. A cathode of the photodiode 111 is connected to a positive power source Vcc, and the resistor 112 is connected to a ground GND. An amplifier 120 of a subsequent stage may be connected to a connection point of the photodiode 111 and the resistor 112 via a coupling capacitor 113. In the photoelectric conversion unit 110, a voltage [Vcc−Vr], where Vcc denotes the voltage of the positive power source and Vr denotes an inter-terminal voltage of the resistor 112, is applied as a reverse bias to the photodiode 111 so that a photocurrent Ipd corresponding to a light intensity of signal light flows through the photodiode 111. Thus, a reverse bias voltage Vpd applied to the photodiode 111 may be expressed as [Vcc−R×Ipd], where R denotes resistance of the resistor 112. The resistor 112 functions as a current-to-voltage (UV) converter which converts the photocurrent Ipd into a voltage and also functions as a bias resistor which applies a bias voltage to the photodiode 111. Furthermore, a low-frequency component may be blocked by the coupling capacitor 113 so that an AC component is applied as an optical signal to the amplifier 120 of the subsequent stage.

However, in most cases, ambient light such as sunlight or light emitted from an electric lamp for an illumination system or a fluorescent lamp as well as the signal light transmitted from the transmitter may be incident upon the diode 111 in visible light communication. Among the ambient light, the sunlight is detected as a DC component of the photocurrent Ipd of the photodiode 111. In addition, when a pre-emphasis or pre-bias process is employed, even the signal light transmitted from the transmitter may be detected as the DC component of the photocurrent Ipd. For these reasons, the DC component of the photocurrent Ipd of the photodiode 111 increases in the environment under a strong sunlight or in the environment close to the transmitter. As a result, the reverse bias voltage Vpd applied to the photodiode 111 decreases as a voltage drop due to the resistor 112 increases. Thus, failing to secure a reverse bias voltage required for operations of the photodiode 111 results in communication errors.

To solve this problem, a direct-current (DC) feedback method or an active bias method has been proposed. For example, the DC feedback method is disclosed in Japanese Patent Laid-open No. 2006-5599. FIG. 10 illustrates a basic circuit configuration of the DC feedback method. As shown in FIG. 10, in the DC feedback method, a light receiving unit 201 is biased by a voltage-controlled current source 202. An alternating current obtained by removing a DC component from an output of the light receiving unit 201 by a DC cut capacitor 203 is supplied to an amplifier 204. Furthermore, the voltage-controlled current source 202 is voltage-controlled by an output of the amplifier 204. Thus, a reverse bias voltage applied to the light receiving unit 201 is maintained constant.

The active bias method is disclosed in Japanese Utility Model Laid-Open No. 56-071643. According to the active bias method, a circuit is configured by replacing the resistor 112 of FIG. 9 with an element (e.g., a cadmium sulfide (Cds) element) whose resistance varies according to light intensity of signal light. Thus, since the resistance of the Cds element decreases with an increase in a DC component of the photocurrent Ipd of the photodiode 111, a reverse bias voltage applied to the photodiode 111 is maintained at a predetermined level or higher.

However, since the DC feedback method uses an active circuit, noise is increased. Moreover, since the DC feedback method uses a feedback control, a time constant of feedback decreases when the DC component of the photocurrent Ipd increases, resulting in an increase in a low-pass cut-off frequency. That is, the DC feedback method has a drawback that a frequency band of a signal is reduced with an increase in the DC component of the photocurrent Ipd. Furthermore, since a circuit using the DC feedback method requires a complicated configuration having a large number of components, cost reduction or miniaturization is precluded.

The active bias method involves allowing the signal light to be incident upon not only the photodiode 111 but also the Cds element. Thus, an arrangement of elements is extremely difficult, and a physical design thereof is very limited. In particular, since it is necessary to prevent communication conditions from affecting a difference in light receiving intensity between two elements, employing a circuit utilizing the active bias method as a product is practically undesirable.

SUMMARY

It is an object of the present invention to provide a visible light receiver circuit, which is only slightly affected by ambient light and has a simple configuration and low noise.

According to one embodiment of the present invention, there is provided a visible light receiver circuit comprising a photoelectric conversion unit, wherein the photoelectric conversion unit includes: a light receiving element having a bias voltage applied thereto and configured to output a photocurrent to an output terminal thereof according to a light intensity of an incident light; a first resistive element connected between the output terminal and ground; and a nonlinear resistive circuit unit connected to the first resistive element in parallel, the nonlinear resistive circuit unit having a resistance decreasing with an increase in an applied voltage thereof.

According to one embodiment of the present invention, a bias voltage applied to the light receiving element is equal to a value obtained by subtracting the product of a resistance of a parallel resistor including the first resistance element and the nonlinear resistive circuit and a photocurrent output from the light receiving element from the DC voltage applied to the series circuit including the light receiving element and the first resistive element. Here, when a DC component of the photocurrent is increased, the resistance of the parallel resistor including the first resistive element and the nonlinear resistive circuit is reduced more than when the DC component of the photocurrent is reduced. This is because the applied voltage of the nonlinear resistive circuit increases with an increase in the DC component of the photocurrent. Thus, even if the DC component of the photocurrent is increased, the bias voltage applied to the light receiving element is ensured. In one embodiment of the present invention, the term "nonlinear resistive circuit" refers to a circuit in which a voltage applied between terminals has a nonlinear relationship to a current flowing by application of the voltage, namely, a circuit whose resistance varies according to the voltage applied between terminals.

Furthermore, according to one embodiment of the present invention, a visible light receiver circuit having a simple configuration may be embodied at low cost by connecting the nonlinear resistive circuit to the first resistive element in parallel. In addition, since active element such as a field effect transistor (FET), a bipolar transistor or an integrated circuit (IC), is not used, a low-noise visible light receiver circuit may be embodied.

In addition, in one embodiment of the present invention, a plurality of nonlinear resistive circuits is connected to the first resistive element in parallel. Thus, the reverse bias voltage applied to the light receiving element is controlled more flexibly.

An example of the nonlinear resistive circuit includes a series circuit of a Zener diode and a second resistive element.

As described above, in accordance with an embodiment of the present invention, a nonlinear resistive circuit is connected in parallel to a first resistive element connected in series to a light receiving element. In accordance with the embodiment of the present invention, the nonlinear resistive is a passive circuit rather than an active circuit and has a simple configuration having a small number of components. Thus, a visible light receiver circuit having the simple configuration and a low noise may be provided. In addition, even if a DC component of a photocurrent increases, the visible light receiver circuit can secure a bias voltage applied to the light receiving element.

DETAILED DESCRIPTION

Figure 8:
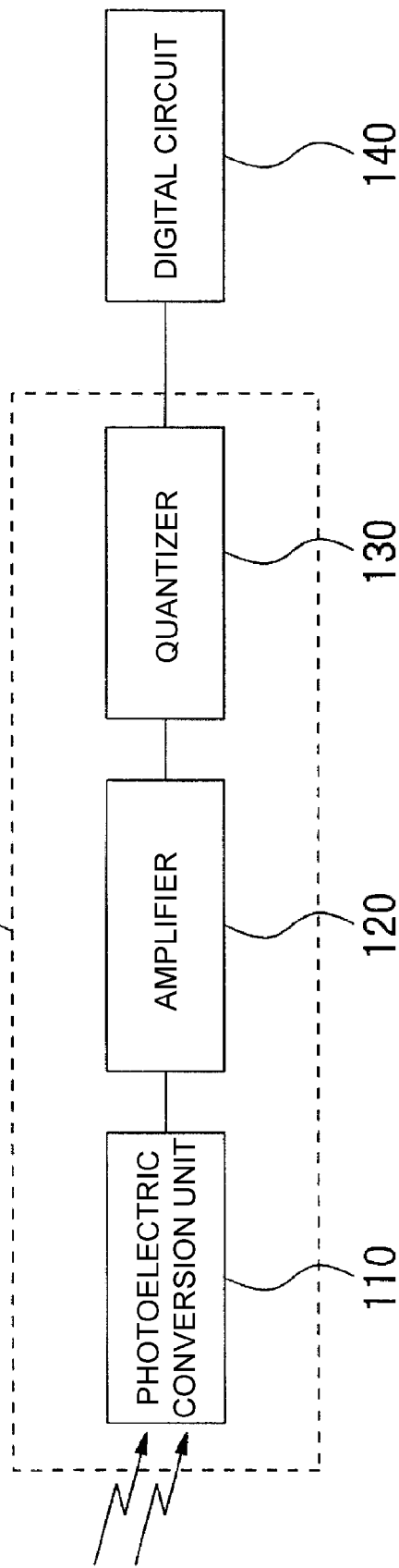
FIG. 8 is a basic block diagram illustrating a visible light receiving apparatus.

Hereinafter, a visible light receiver circuit according to one embodiment of the present invention will be described with reference to the accompanying drawings. A basic configuration of the visible light receiver circuit according to one embodiment is same as described above with reference to FIG. 8. One feature of the visible light receiver circuit according to one embodiment is a circuit configuration of a photoelectric conversion unit. The photoelectric conversion unit according to one embodiment of the present invention will now be described in detail with reference to FIG. 1, which is a circuit diagram illustrating the photoelectric conversion unit.

Figure 1:
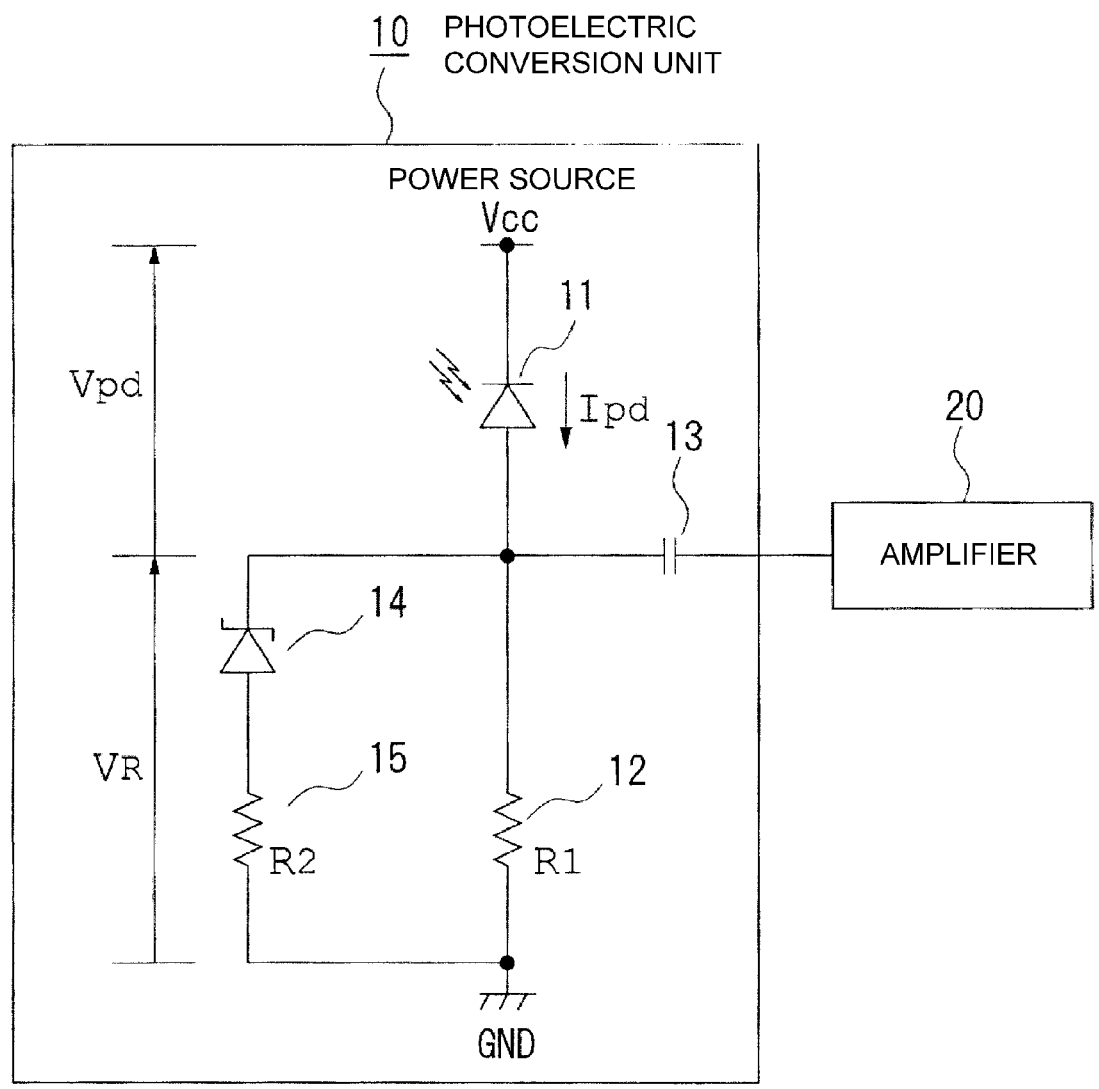
FIG. 1 is a circuit diagram illustrating a photoelectric conversion unit according to one embodiment of the present invention.

As shown in FIG. 1, a photoelectric conversion unit 10 includes a photodiode 11 serving as a light receiving unit and a resistor 12 connected to an anode of the photodiode 11 in series. A cathode of the photodiode 11 is connected to a positive power source Vcc, and the resistor 12 is connected to a ground GND. An amplifier 20 of a subsequent stage is connected to a connection point between the photodiode 11 and the resistor 12 via a coupling capacitor 13. The photodiode 11, the resistor 12, and the coupling capacitor 13 are same as those of the conventional one, respectively.

In the embodiment of the present invention, a nonlinear resistive circuit is connected to the resistor 12 in parallel. For example, a series circuit including a Zener diode 14 and a resistor 15 is used as the nonlinear resistive circuit. As shown in FIG. 1, a cathode of the Zener diode 14 is connected to the connection point between the photodiode 11 and the resistor 12, and the resistor 15 is connected to the ground GND. In such configuration, a reverse voltage is applied to the Zener diode 14. Almost no current flows through the Zener diode 14 when a reverse voltage equal to or lower than a breakdown voltage is applied while a large current flows through the Zener diode 14 when a reverse voltage higher than the breakdown voltage is applied. In other words, the Zener diode 14 functions as a high-resistance element when the reverse voltage equal to or lower than the breakdown voltage is applied while the Zener diode 14 functions as a low-resistance element when the reverse voltage higher than the breakdown voltage is applied. In addition, a voltage between two terminals of the Zener diode 14 is almost constant (Zener voltage) when the reverse voltage higher than the breakdown voltage is applied. That is, the Zener diode 14 functions as a constant voltage source when the reverse voltage higher than the breakdown voltage is applied, and an impedance is almost zero (0) (or sufficiently small). In the embodiment, a terminal capacitance (junction capacitance or floating capacitance) of the Zener diode 14 is about 1/5 or less the junction capacitance of the photodiode 11. This is because the junction capacitance of the photodiode 11 affects the frequency band of a circuit.

As shown in FIG. 1, the reverse bias voltage Vpd of the photodiode 11 is expressed as [Vcc−VR] where Vcc denotes a power supply voltage of the positive power source Vcc. The voltage VR is the product of the photocurrent Ipd and the parallel resistance of the resistance R1 of the resistor 12 and the resistance of the series circuit including the Zener diode 14 and the resistor 15, i.e. [resistance Rz of the Zener diode 14+resistance R2 of the resistor 15]. When the resistance Rz of the Zener diode 14 is sufficiently high, the parallel resistance approximates the resistance R1 of the resistor 12. On the other hand, when the resistance Rz of the Zener diode 14 is sufficiently low, the parallel resistance approximates the parallel resistance of resistance R1 of the resistor 12 and the resistance R2 of the resistor 15.

Figure 2:
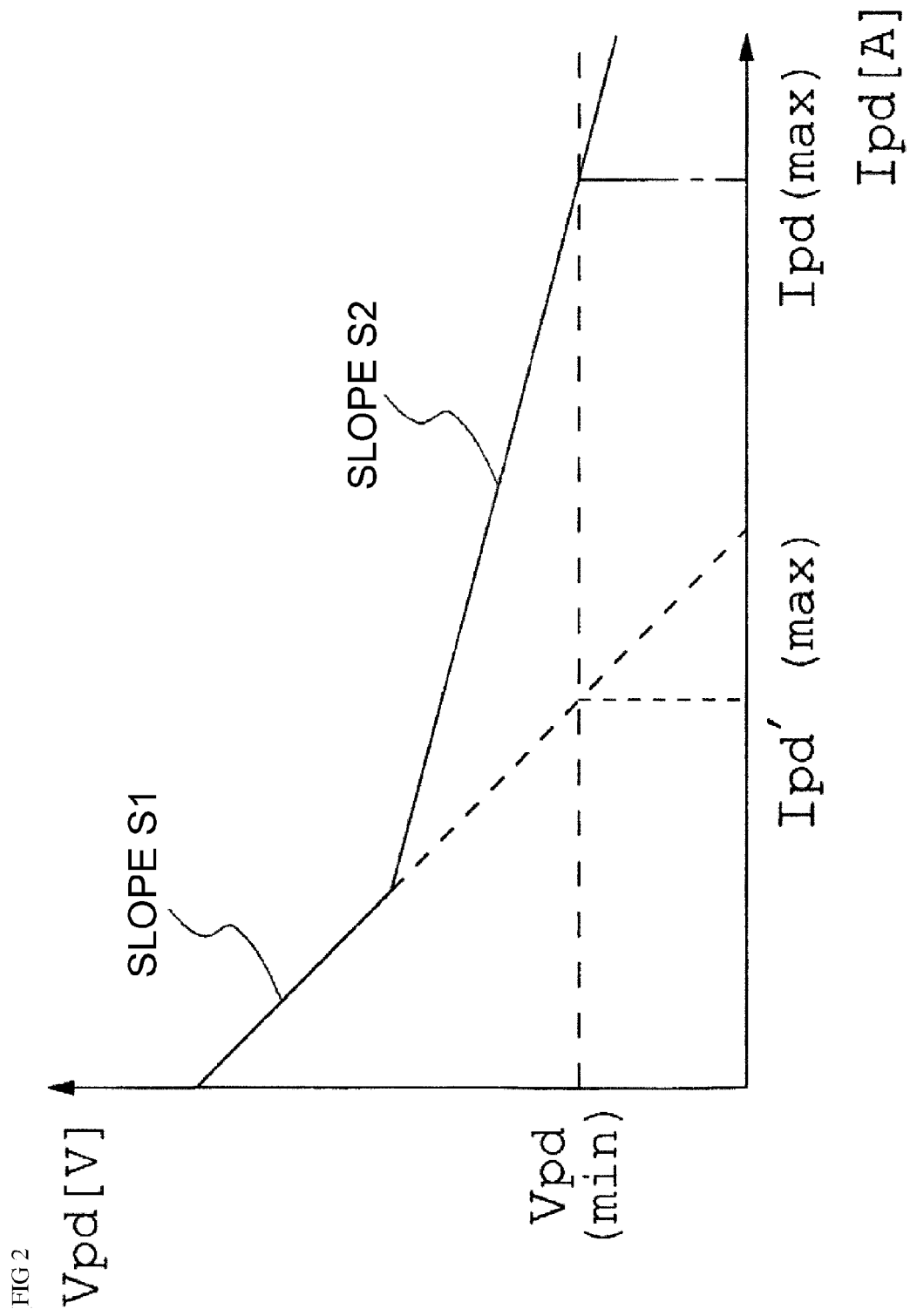
FIG. 2 is a graph depicting a relationship between a photocurrent of a photodiode and a reverse bias voltage.

Thus, the reverse bias voltage Vpd of the photodiode 11 relative to the photocurrent Ipd of the photodiode 11 may be represented as the graph shown in FIG. 2. As shown in FIG. 2, slope S1 represents a case where the photocurrent Ipd is small, while slope S2 represents a case where the photocurrent Ipd is large. The slope S1 depends on the resistance R1 of the resistor 12. In addition, the slope S2 depends on the parallel resistance of the resistance R1 of the resistor 12 and resistance R2 of the resistor 15. A slope turning point depends on the breakdown voltage of the Zener diode 14. Resistance Rz of the Zener diode 14 varies largely about the breakdown voltage. Although slope S1 is discontinuously changed into slope S2 at the slope turning point in FIG. 2, the slope continuously varies in an actual circuit. Thus, the photoelectric conversion unit 10 normally operates at the slope turning point.

Figure 9:
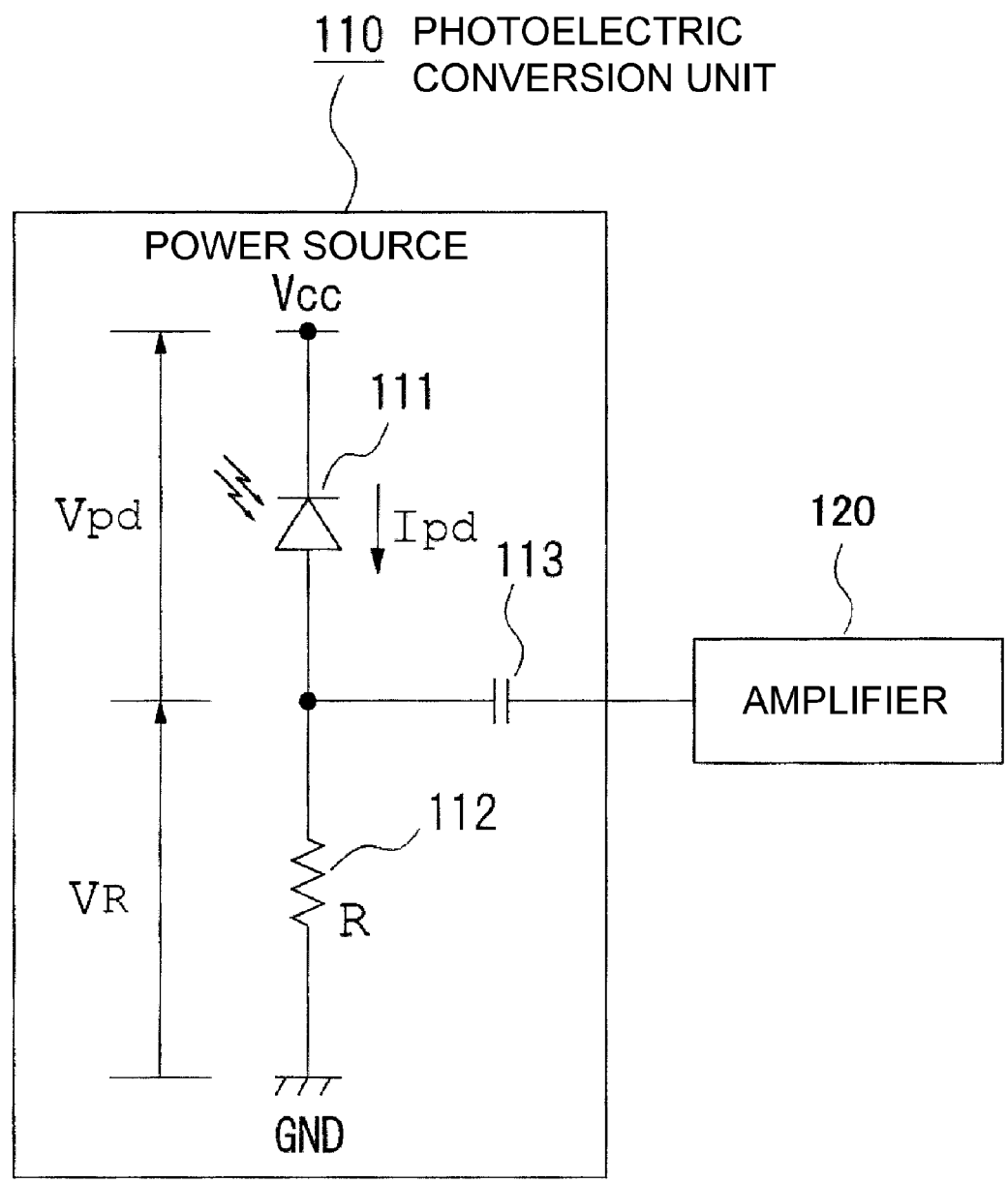
FIG. 9 is a circuit diagram illustrating a conventional photoelectric conversion unit.
Figure 10:
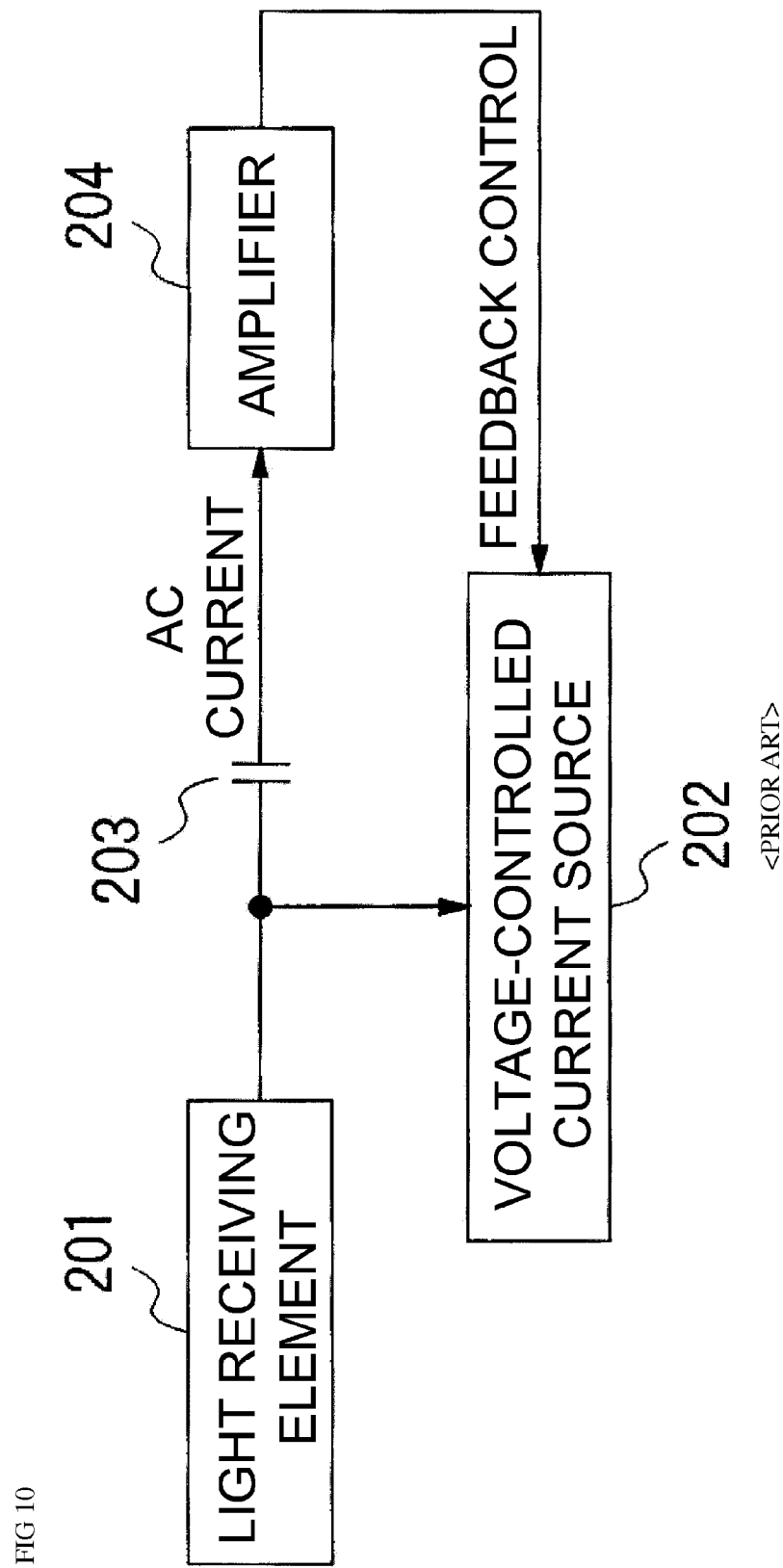
FIG. 10 is a circuit diagram illustrating a conventional photoelectric conversion unit.

As apparent from FIG. 2, the maximum value [Ipd(max)] of photocurrent Ipd of the photodiode 11 is limited by minimum reverse bias voltage [Vpd(min)] required for allowing the photodiode 11 to function as a reverse bias source. The dotted line in FIG. 2 denotes a relationship between a photocurrent and a reverse bias voltage in the conventional photoelectric conversion unit 110 shown in FIG. 9. As shown in FIG. 2, the maximum value [Ipd(max)] of the photocurrent Ipd according to one embodiment becomes greater than the maximum photocurrent [Ipd'(max)] of the conventional one. Thus, even if the DC component of the photocurrent Ipd of the photodiode 11 increases in an environment such as under a strong sunlight or a short distance to a transmitter, the reverse bias voltage Vpd of the photodiode 11 is secured so that the visible light receiver circuit operates normally.

In accordance with the visible light receiving apparatus of one embodiment of the present invention described above, the reverse bias voltage Vpd required for the operation of the photodiode 11 can be secured over a wide range of photocurrent Ipd. Thus, even if ambient light having high intensity affects the DC component of the photocurrent Ipd, a normal communication state is maintained. In particular, since a simple scheme of connecting the series circuit including the Zener diode 14 and the resistor 15 to the resistor 12 in parallel is employed in order to secure the reverse bias voltage Vpd required for the operation of the photodiode 11, cost reduction and miniaturization can be facilitated in accordance with one embodiment of the present invention. Moreover, since the photoelectric conversion unit 10 does not use active components, an increase in noise can be prevented in accordance with one embodiment of the present invention,.

Figure 3:
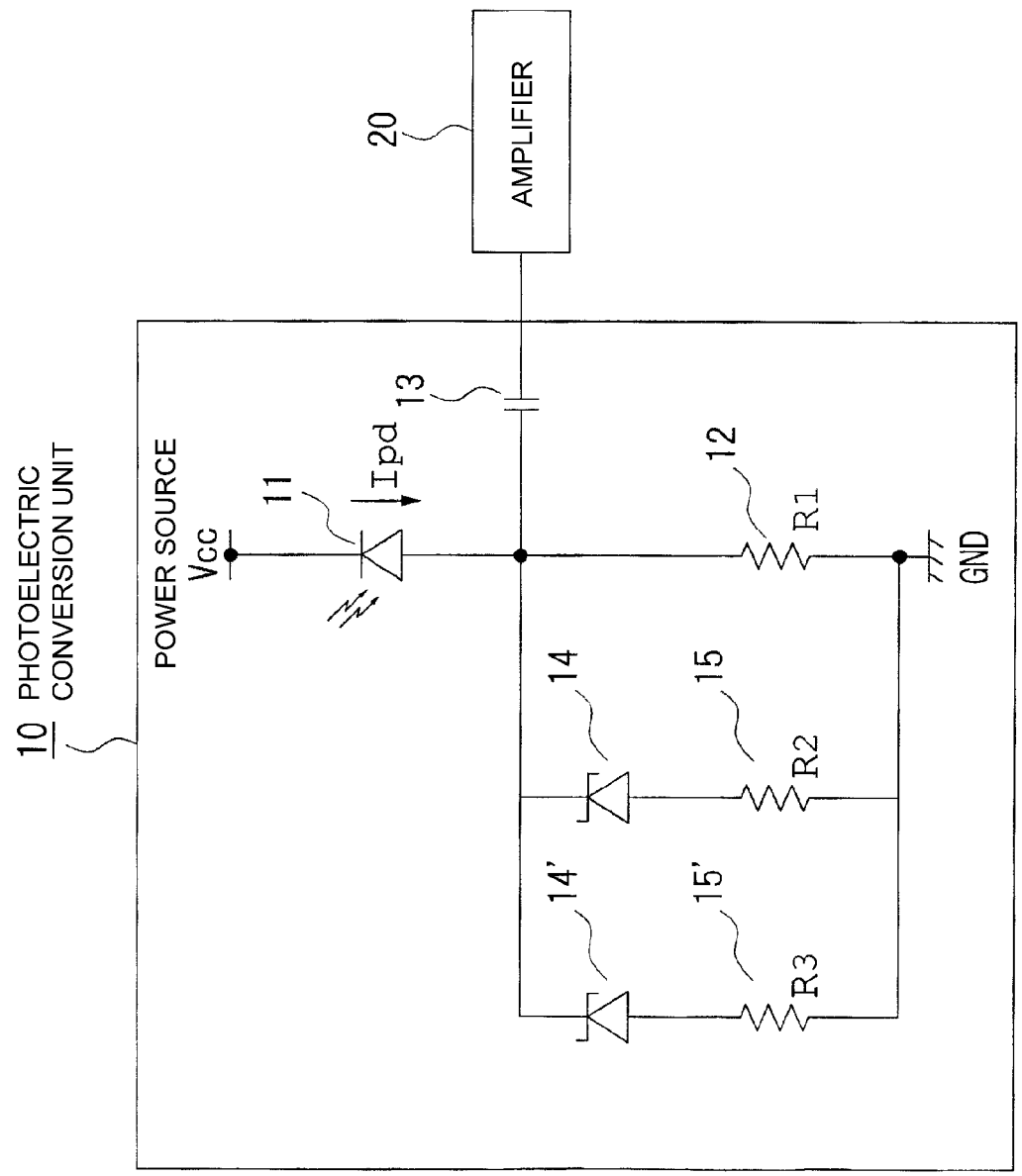
FIG. 3 is a circuit diagram illustrating a photoelectric conversion unit according to another embodiment of the present invention.
Figure 4:
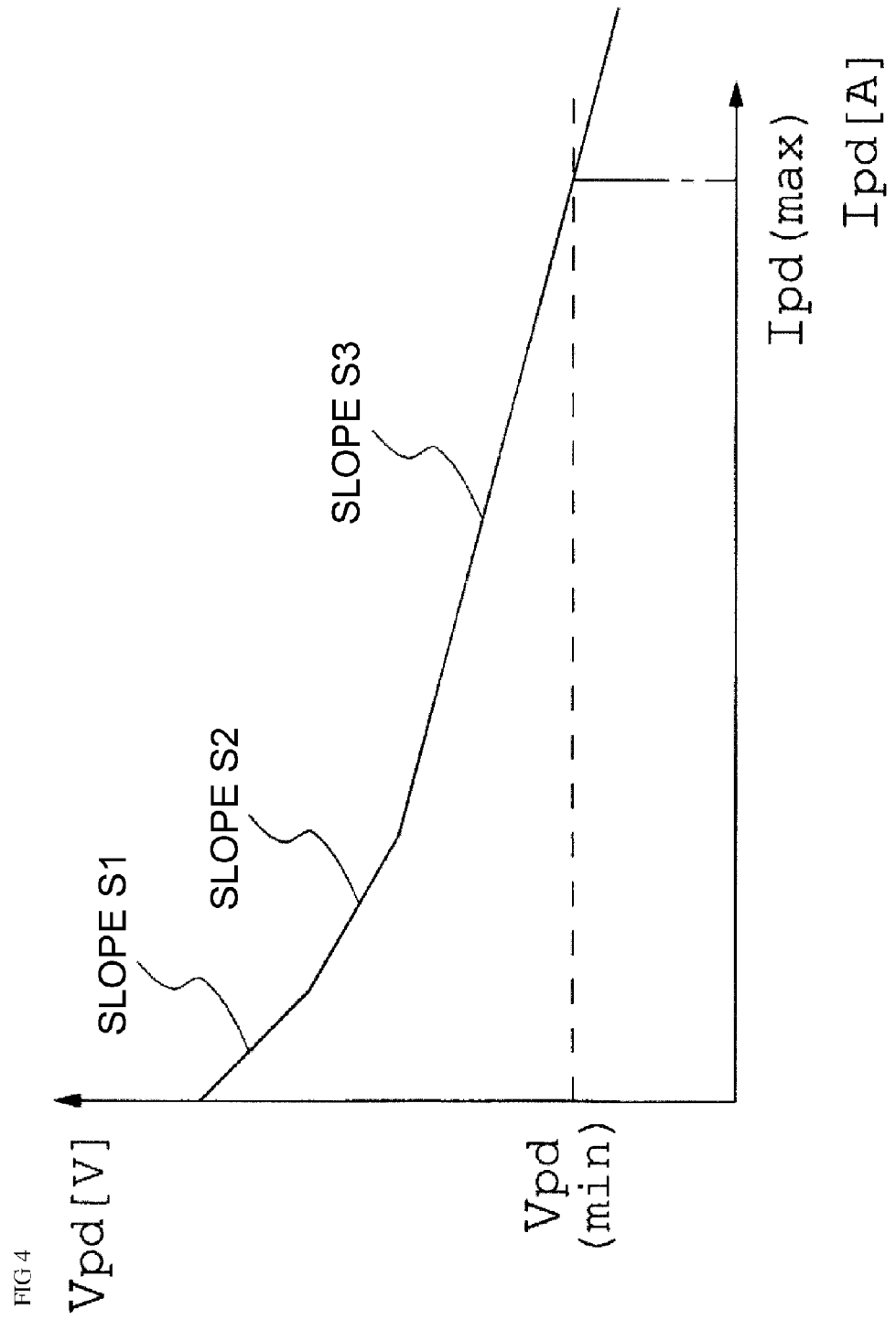
FIG. 4 is a graph depicting a relationship between a photocurrent of a photodiode and a reverse bias voltage.

The present invention may be modified in many different forms and should not be construed as being limited to the embodiment described above. For example, while a single series circuit including the Zener diode 14 and the resistor 15 is connected to the resistor 12 in parallel as the nonlinear resistive circuit, a plurality of series circuits, each of which including a Zener diode and a resistor, may be connected to the resistor 12 in parallel. For example, as shown in FIG. 3, another series circuit including a Zener diode 14' and a resistor 15' may be connected to a resistor 12 and a series circuit including a Zener diode 14 and a resistor 15 in parallel. In accordance with an embodiment of the present invention, the Zener diodes 14 and 14' may have different breakdown voltages. FIG. 4 illustrates a relationship between photocurrent Ipd and reverse bias voltage Vpd in a photoelectric conversion unit 10 of FIG. 3. Slope S1 depends on resistance R1 of the resistor 12. In addition, slope S2 depends on a parallel resistance of the resistance R1 of the resistor 12 and resistance R2 of the resistor 15. Further, slope S3 depends on a parallel resistance of the resistance R1 of the resistor 12, the resistance R2 of the resistor 15, and resistance R3 of the resistor 15'.

Figure 5:
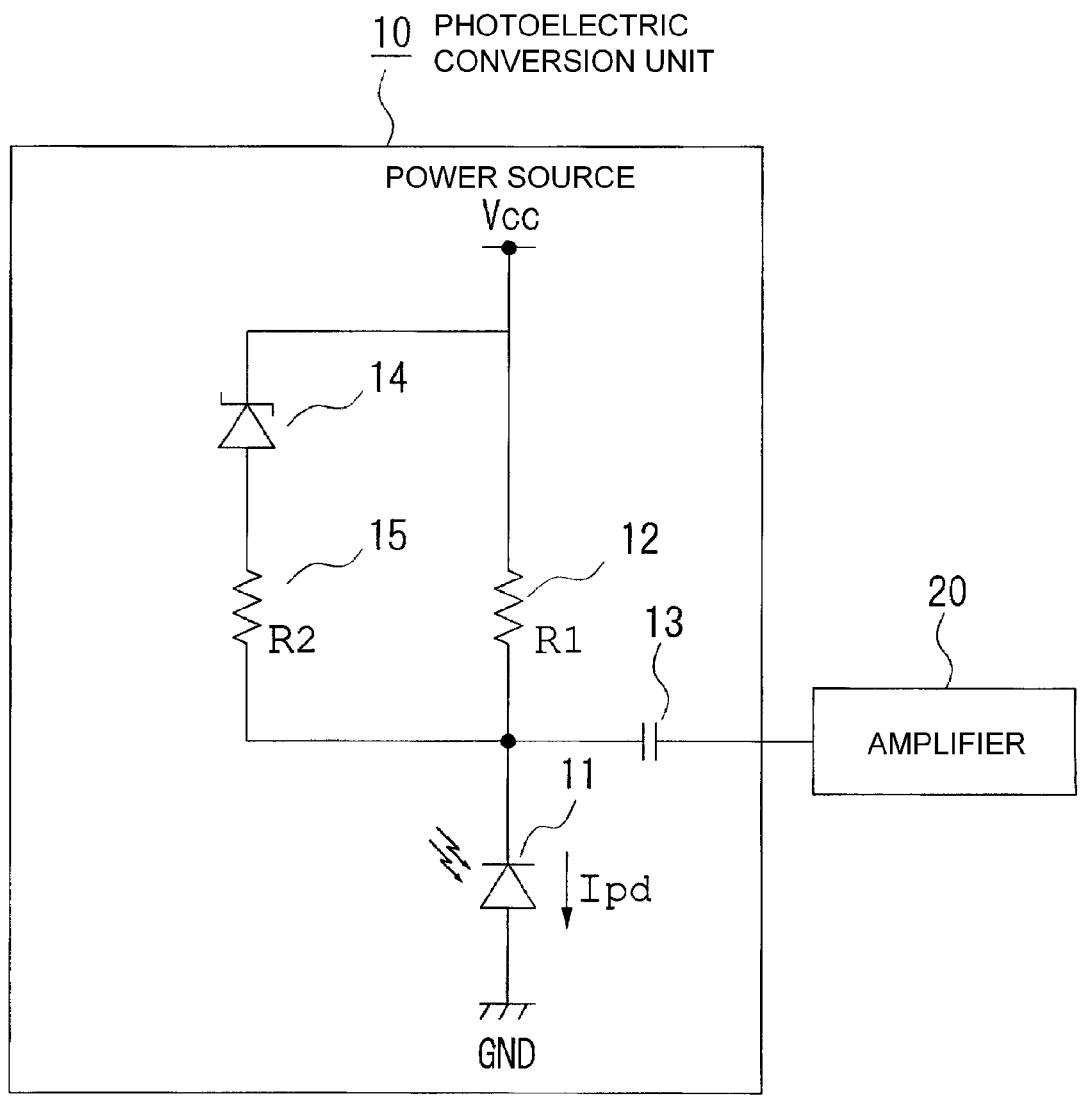
FIG. 5 is a circuit diagram illustrating a photoelectric conversion unit according to yet another embodiment of the present invention.

In the photoelectric conversion unit 10 in accordance with an embodiment of the present invention shown in FIG. 5, the resistor 12 may be connected to a positive power source Vcc, a cathode of the photodiode 11 may be connected to the resistor 12, and an anode of the photodiode 11 may be grounded.

In the photoelectric conversion unit 10 according to an embodiment of the present invention, other nonlinear resistive elements such as a varistor may be employed in place of the Zener diode 11. The varistor provides the same effect as the Zener diode 11 since the varistor is an element whose electrical resistance nonlinearly varies according to a voltage applied between terminals despite the fact that the varistor has no polarity.

In accordance with one embodiment of the present invention, a phototransistor may be employed instead of the photodiode 11.

Figure 6:
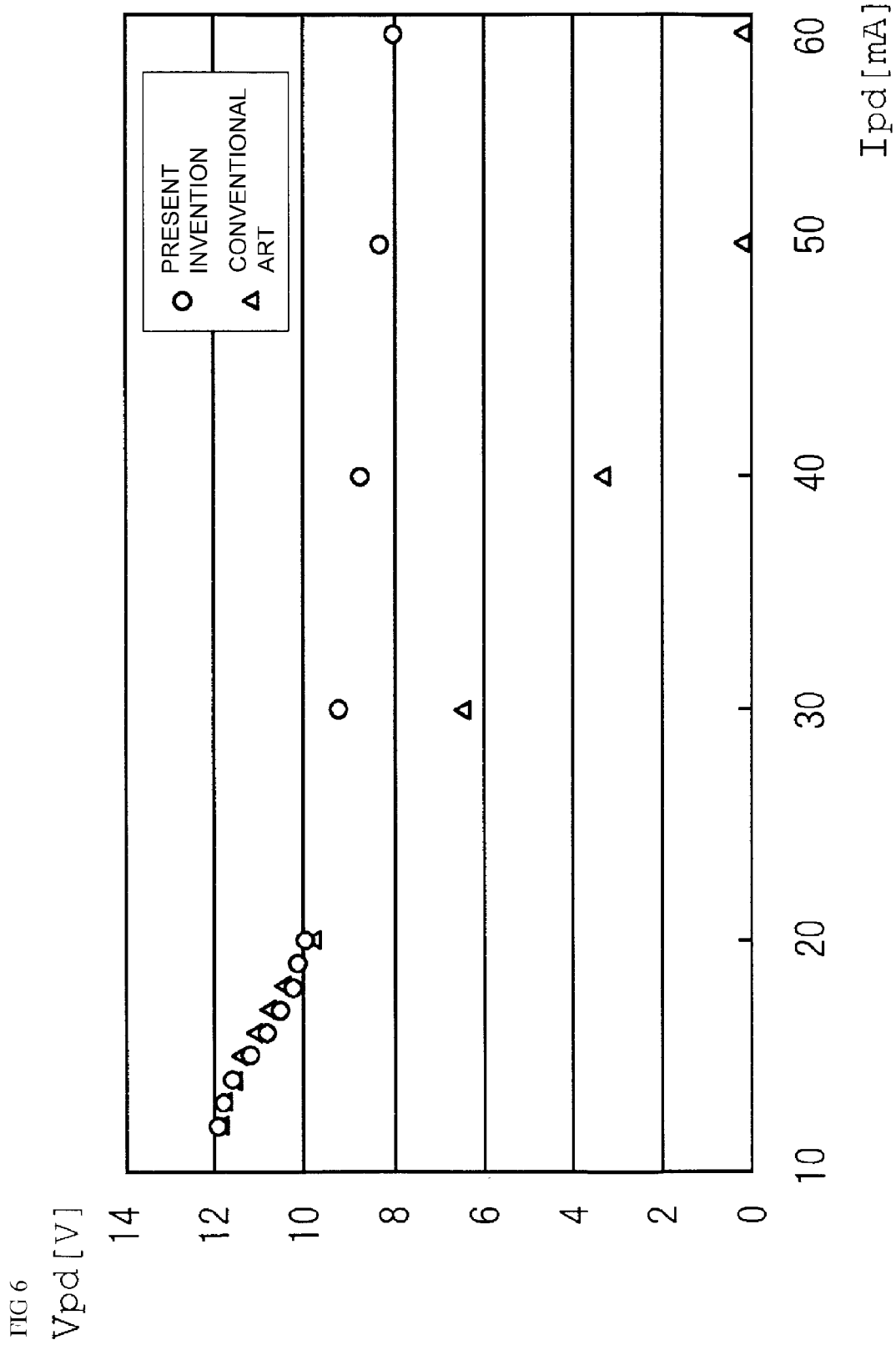
FIG. 6 is a graph depicting a relationship between a photocurrent of a photodiode and a reverse bias voltage.

FIG. 6 is a graph depicting a relationship between a photocurrent Ipd of a photodiode 11 and a reverse bias voltage Vpd measured by an experiment in a photoelectric conversion unit 10 in accordance with one embodiment of the present invention.

In the experiment, 5.1 kΩ resistor is used as the resistor 12, 0.5 kΩ resistor is used as the resistor 15, 0.1 µF capacitor is used as the capacitor 13, 1N5227B is used as the Zener diode 14, and S6436 having an inter-terminal capacitance of 15 pF is used as the photodiode 11 in the photoelectric conversion unit 10 shown in FIG. 1. In addition, FIG. 6 depicts a relationship between the photocurrent Ipd and the reverse bias voltage Vpd in the conventional photoelectric conversion unit 110 shown in FIG. 9 as a comparative example. In the conventional photoelectric conversion unit 110, 5.1 kΩ resistor is used as the resistor 112, 0.1 µF capacitor is used as the capacitor 113, and S6436 having an inter-terminal capacitance of 15 pF is used as the photodiode 111. It is apparent from FIG. 6 that a range of the photocurrent Ipd where the photoelectric conversion unit 10 is in normal operation is wider than that of the conventional one.

Figure 7:
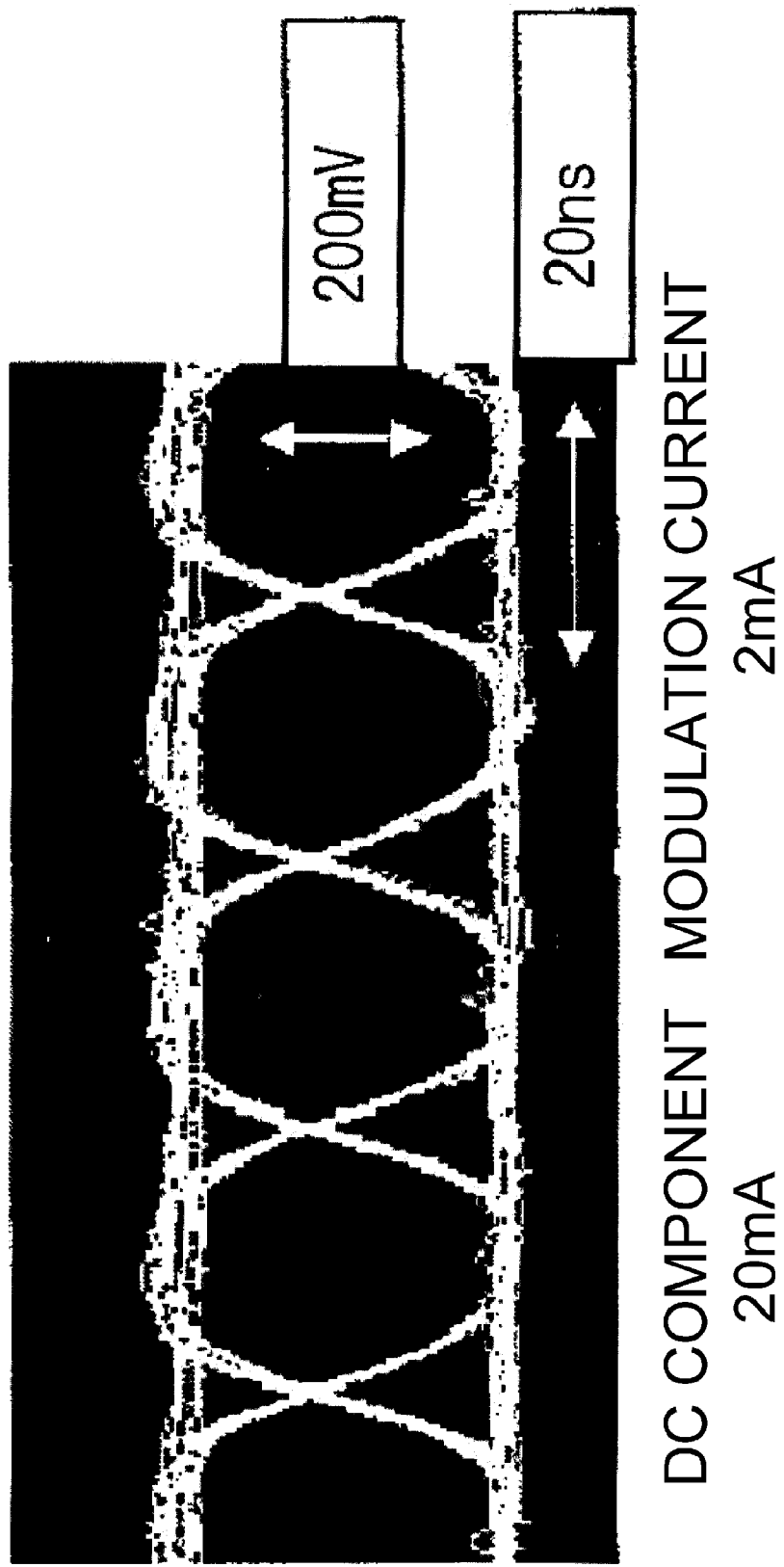
FIG. 7 illustrates an example of an output waveform of a photoelectric conversion unit according to an embodiment of the present invention.

In addition, an output waveform of the photoelectric conversion unit 10 is evaluated by radiating a modulated signal light on the photodiode 11 of the photoelectric conversion unit 10. The output waveform is shown in FIG. 7. The output waveform of the photoelectric conversion unit 10 is measured by driving an LED serving as a light source with a random pattern of 50 Mbps and radiating the signal light emitted from the LED on the photodiode 11. The light source or an environmental is controlled such that the photocurrent Ipd has a modulation current of 2 mA and a DC component of 20 mA. The result of the evaluation of a signal-to-noise ratio (SNR) of an output signal of the photoelectric conversion unit 10 using an eye pattern under such condition is shown in FIG. 7. It is apparent from FIG. 7 that a good eye pattern having a sufficiently high SNR is generated using the photoelectric conversion unit 10 according to the present embodiment. Based on the eye pattern, it can be inferred that the photoelectric conversion unit 10 according to the present embodiment is hardly affected by noise of the Zener diode 14, has a simple configuration and is sufficiently practical.

What is claimed is:

1. A visible light receiver circuit comprising:
   a photodiode having a cathode connected to a positive terminal of a voltage source, wherein the photodiode is configured to output a photocurrent according to an intensity of an incident light;
   a first resistive element connected to an anode of the photodiode in series;
   an amplifier connected to a node where the anode of the photodiode and the first resistive element are connected; and
   a nonlinear resistive circuit connected to the first resistive element in parallel, the nonlinear resistive circuit comprising a Zener diode having a cathode connected to the node and a second resistive element connected to an anode of the Zener diode.

2. The visible light receiver circuit according to claim 1, further comprising one or more nonlinear resistive circuits connected to the first resistive element in parallel.

3. A visible light receiver circuit comprising:
   a first resistive element connected to a positive terminal of a voltage source;
   a photodiode having a cathode connected to the first resistive element in series, wherein the photodiode is configured to output a photocurrent according to an intensity of an incident light;
   an amplifier connected to a node where an anode of the photodiode and the first resistive element are connected; and
   a nonlinear resistive circuit connected to the first resistive element in parallel, the nonlinear resistive circuit comprising a Zener diode having a cathode connected to the positive terminal of the voltage source and a second resistive element connected between an anode of the Zener diode and the node.

4. The visible light receiver circuit according to claim 3, further comprising one or more nonlinear resistive circuits connected to the first resistive element in parallel.

* * * * *